United States Patent [19]
Murata

[11] Patent Number: 4,639,696
[45] Date of Patent: Jan. 27, 1987

[54] DELAY LINE

[75] Inventor: Kiyobumi Murata, Saitama, Japan

[73] Assignee: Toko, Inc., Tokyo, Japan

[21] Appl. No.: 795,174

[22] Filed: Nov. 5, 1985

[30] Foreign Application Priority Data

Nov. 6, 1984 [JP] Japan .............................. 59-168411[U]

[51] Int. Cl.[4] .............................................. H03H 7/32
[52] U.S. Cl. .................................... 333/138; 333/140; 336/192
[58] Field of Search .......................... 333/23, 138–140, 333/167, 184, 185, 177; 336/192, 185, 199, 221, 225

[56] References Cited

U.S. PATENT DOCUMENTS 3,609,616 9/1971 Duméige .............................. 336/192
4,506,238 3/1985 Endoh et al. ................... 333/140 X Primary Examiner—Marvin L. Nussbaum

[57] ABSTRACT

In a lumped constant type delay line device comprising a plurality of terminals securely attached to a base plate of an insulating material, and a plurality of cores each having a coil wound thereon, an electrode is provided on the top surface of each core, and a tap of each coil is connected to the electrode.

6 Claims, 7 Drawing Figures

DELAY LINE

BACKGROUND OF THE INVENTION

1. Field of the Invention

This invention relates to an electric delay circuit element such as a so-called delay line arranged to delay an electric signal for a predetermined period of time and which is used at various points in a pulse circuit in the fields of electronic computers, electrical communications equipment, and other various electronic applications. More particularly, the present invention pertains to a lumped constant type delay line device.

2. Description of the Prior Art

In order to have a better understanding of the present invention, description will first be made of a conventional lumped constant type delay line device with reference to FIGS. 1 to 3 of the accompanying drawings. The conventional lumped constant type delay line device is constructed by using coils 10 and capacitors 20 as shown in FIG. 1.

FIG. 2 illustrates, by way of example, the construction of such conventional lumped constant type delay line device, prior to encapsulation with a plastic material. More specifically, in the illustrated construction, a plurality of capacitors 20 are soldered to wiring patterns printed on the bottom surface of a printed circuit board 30, and a plurality of coils 10 each wound on a core 40 formed of ferrite, cermics or the like are mounted on the top surface of the printed circuit board 30. Lead wire 12 of the coil 10a at the input end, lead wire 14 of the coil 10b at the output end, and taps of the respective coils 10 are connected, by soldering, to the printed wiring patterns of the printed circuit board 30 and then to terminals 50.

To assemble such delay line device, it has heretofore been the practice to take the following procedures:

First, the coils 10 are continuously wound onto the cores 40; then taps 16 are formed by twisting; and the free ends of the taps 16 are pre-soldered. Meanwhile, capacitors 20 are attached, by soldering, onto the bottom surface of the printed circuit board 30, and the cores 40, which are connected together through the coils 10, are fixed to the top surface of the printed circuit board 30. Subsequently, the lead wires 12, 14 and taps 16 of the coils 10 are led out and soldered to predetermined connection points in the printed wiring patterns.

Thereafter, the printed circuit board 30, which has the coils 10 and capacitors 20 mounted thereon, is placed in such a manner that the terminals 50 can be held between two rows of lead frames (not shown), and the printed wiring patterns are soldered to the terminals 50 at the connection points where the lead wires 12, 14 and taps 16 have been soldered. Unwanted portions of the lead frames are then cut off, and in this way the construction of a delay line device such as shown in FIG. 2 is realized.

However, the above-described conventional construction is disadvantageous in that the taps 16 of the coils 10 must be twisted since they are elongated in the form of loop as shown in FIG. 3, and would otherwise become loose so that difficulty would be experienced in an attempt to solder the taps to the printed wiring patterns, and in a worse case the taps 16 would be cut off or shorted. Another disadvantage is such that difficulty is involved in an attempt to automate the operation of soldering the elongated taps 16 to the predetermined portions of the printed wiring patterns; thus it has heretofore been the practice that such soldering operation is performed manually.

SUMMARY OF THE INVENTION

It is an object of the present invention to provide a novel and improved lumped constant type delay line device which is free from the aforementioned drawbacks of the prior art.

Another object of the present invention is to provide a lumped constant type delay line device wherein electrodes for taps of coils are provided on the top surfaces of cores, and the electrodes, after the taps are connected thereto, are directly connected to terminals of the device, thereby eliminating the above-mentioned step of twisting the taps, while at the same time facilitating automation of the assembling operation.

Other objects, features and advantages of the present invention will become apparent from the ensuing description taken in conjunction with the accompanying drawings.

DESCRIPTION OF THE PREFERRED EMBODIMENTS

Figure 1:
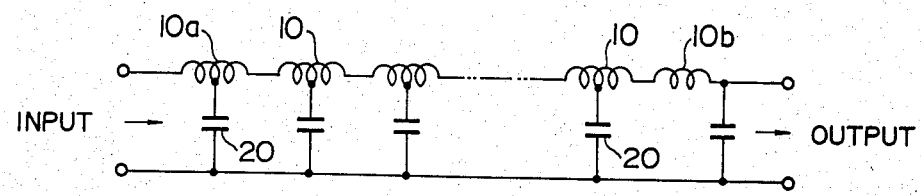
FIG. 1 is a circuit diagram illustrating an example of a delay line.
Figure 2:
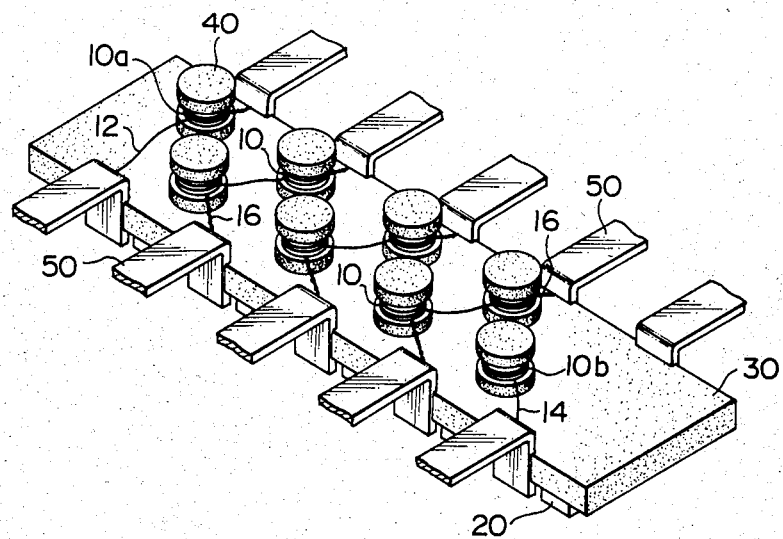
FIG. 2 is a perspective view, partly cut off, showing the construction of a conventional delay line.
Figure 3:
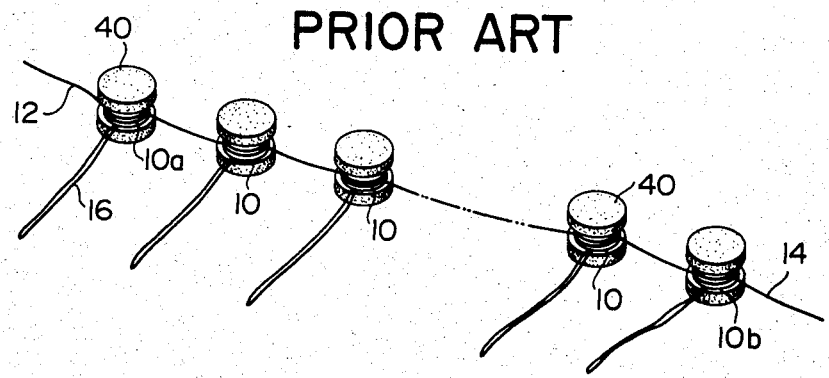
FIG. 3 is a perspective view showing conventional cores each having a coil wound thereon.
Figure 4:
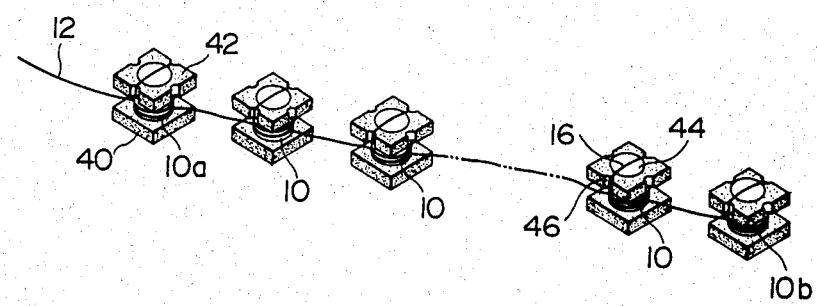
FIG. 4 is a perspective view showing cores each having a coil wound thereon according to a first embodiment of the present invention.
Figure 5:
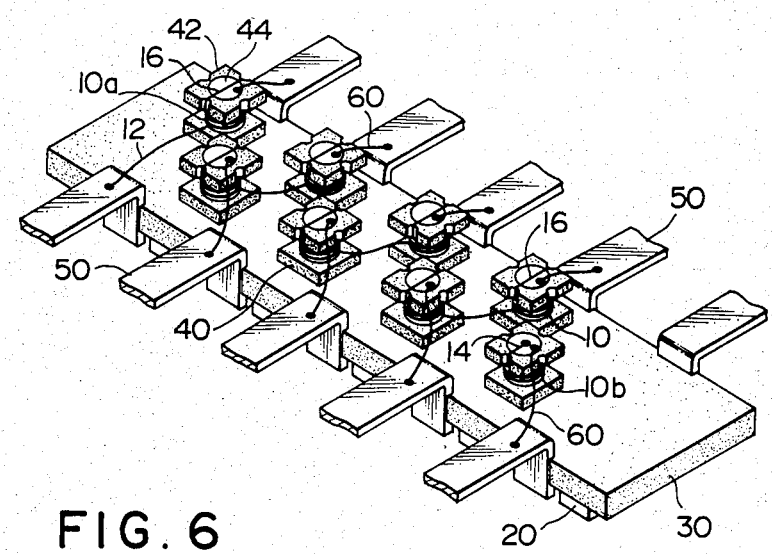
FIG. 5 is a perspective view, partly cut off, showing the construction of the delay line device according to the first embodiment of the present invention.
Figure 6:
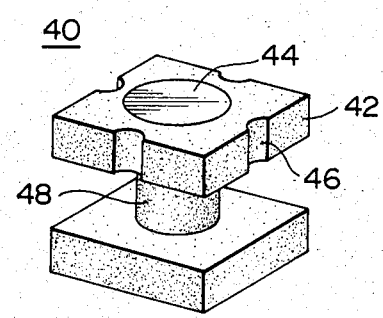
FIG. 6 is an enlarged perspective view showing the core according to the first embodiment of the present invention.

FIGS. 4 to 6 illustrate the lumped constant type delay line device according to an embodiment of the present invention, wherein parts corresponding to FIGS. 1 to 3 are indicated by like reference numerals.

FIG. 5 shows, like FIG. 2, the construction of the delay line, prior to encapsulation with a plastic material except for terminals 50. Referring to FIG. 6, there is shown an example of core 40 which comprises a drum portion 48 onto which a coil 10 is wound, and a pair of flanges provided at the opposite ends of the drum portion respectively. One of the flanges, indicated at 42, has receesses 46 formed in the four side faces thereof. The flange 42 is also provided on the top surface with an electrode 44 for connecting the tap 16 of the coil thereto. The electrode 44 may be formed by printing and baking silver paste. In the course of winding the coil 10 onto the drum portion 48, the tap is led out, through one of the recesses 46, to the top surface of the flange 42 in such a manner as to straddle the electrode 44. Subsequently, the coil 10 is again wound onto the drum portion 48. More specifically, the coils 10 are successively wound onto the drum portion 48 of the respective cores 40, and in the course of the winding operation, the taps 16 are led out and retained at the flanges 42 as shown in FIGS. 4 and 5. The taps 16 led out at the top surfaces of the cores 40 and the lead wire 14 of the coil at the output end are connected to the electrodes 44 by means of ultrasonic bonding, soldering or the like. The cores 40 are securely attached to the printed circuit board 30 at predetermined positions by means of a bonding agent, pressure sensitive adhesive double coated tape or the like; thereafter, the lead wire 12 of the coil at the input end is connected to the corresponding terminal 50; and the electrodes 44 and terminals 50 are connected to each other through wires 60 which may be polyurethane-covered wires or the like. Such connection can be effected by means of ultrasonic bonding, soldering or the like as is the case with the taps 16.

Although in the illustrated embodiment, the coil 10b at the output end includes no tap and thus has its lead wire 14 connected to the associated electrode 44, it is also possible that the coil 10b may include a tap, and in such a case, the tap of the coil 10b may be connected to the associated electrode 44, and the lead wire 14 of the coil 10b may be connected directly to the corresponding terminal 50.

Figure 7:
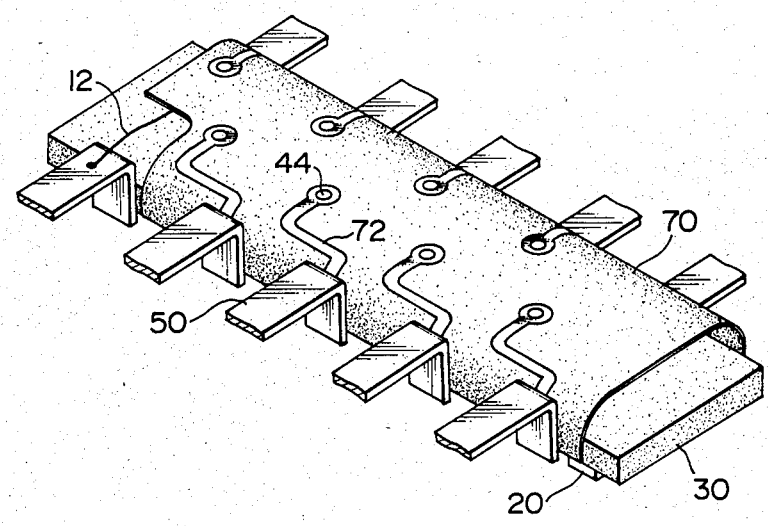
FIG. 7 is a perspective view, partly cut off, showing a second embodiment of the present invention.

Referring to FIG. 7, there is shown another embodiment of the present invention, wherein a flexible printed circuit board 70 is used instead of the wires 60; the printed circuit board 30 is covered with the flexible board 70; and electrodes 44 and terminals 50 are connected to each other through conductor patterns 72 provided on the flexible board 70.

As will be appreciated from the foregoing discussion, the tap leading-out structure of the lumped constant type delay line device according to this invention is well adapted for automatic assembling operation.

Furthermore, according to the present invention, before the cores are attached to the printed circuit board, the taps of the coils are securely attached to the electrodes provided on the cores; thus, there are no elongated taps extending from the cores, so that no tap twisting step is required, and the operation for disposing the cores onto the printed circuit board at predetermined positions can be automated.

Still furthermore, according to the present invention, the positions of the electrodes for the taps are predetermined; thus, the connection between the taps and electrodes and the connection between the electrodes and the terminals can easily be automated, so that a greatly enhanced productivity can be realized.

While the invention has been illustrated and described with respect to specific embodiments thereof, it is to be understood that the invention is by no means limited thereto but covers all changes and modifications which will become possible within the scope of the appended claims.

I claim:

1. A lumped constant type delay line device, comprising:
   a base plate formed of a insulating material;
   a plurality of terminals securely attached to said base plate;
   a plurality of cores each having a coil wound thereon and each having a top surface, each of said coils being provided with a tap; and
   a plurality of planar electrodes respectively intimately adhering to the top surfaces of said cores, said taps being connected to said electrodes respectively.

2. A delay line device according to claim 1, wherein each of said cores includes a flange having a plurality of recesses formed in the peripheral surface of the respective core, and a drum portion; said electrodes being provided on said flanges respectively; and the taps being led out at the top surface of the respective flange, in such a manner as to straddle the respective electrode and pass through one of the recesses.

3. A delay line device according to claim 1, wherein said electrodes and said terminals are connected to each other through wires.

4. A delay line device according to claim 2, wherein said electrodes and said terminals are connected to each other through wires.

5. A delay line device according to claim 1, wherein said electrodes and terminals are connected through conductor patterns provided on a flexible printed circuit board.

6. A delay line device according to claim 2, wherein said electrodes and said terminals are connected to each other through conductor patterns provided on a flexible printed circuit board.

* * * * *